United States Patent [19]

Momose

[11] Patent Number: 5,227,855
[45] Date of Patent: Jul. 13, 1993

[54] SEMICONDUCTOR MEMORY DEVICE HAVING A FERROELECTRIC SUBSTANCE AS A MEMORY ELEMENT

[75] Inventor: Hisayo S. Momose, Tokyo, Japan

[73] Assignee: Kabushiki Kaisha Toshiba, Kawasaki, Japan

[21] Appl. No.: 644,916

[22] Filed: Jan. 23, 1991

[30] Foreign Application Priority Data

Jan. 24, 1990 [JP] Japan .................................. 2-12676

[51] Int. Cl.$^5$ .............................................. G11C 11/22
[52] U.S. Cl. .................................... 365/145; 365/141; 257/295
[58] Field of Search .................. 365/145, 147, 149, 51; 357/23.5, 23.6, 59; 257/295

[56] References Cited

U.S. PATENT DOCUMENTS

| 3,832,700 | 8/1974 | Wu et al. .............................. 357/23.5 |
| 4,149,302 | 4/1979 | Cook ..................................... 357/51 X |
| 4,888,630 | 12/1989 | Paterson ............................. 357/23.5 |
| 5,046,043 | 9/1991 | Miller et al. ........................ 365/145 |
| 5,099,305 | 3/1992 | Takenaka ......................... 365/145 X |
| 5,101,251 | 3/1992 | Wakamiya et al. ................. 357/23.6 |
| 5,119,154 | 6/1992 | Gnadinger ......................... 357/23.6 |

FOREIGN PATENT DOCUMENTS

| 0396221 | 11/1990 | European Pat. Off. ............ 365/145 |
| 0186669 | 7/1990 | Japan ................................. 365/145 |
| 0229472 | 9/1990 | Japan ................................. 365/145 |

OTHER PUBLICATIONS

Moazzami et al., A Ferroelectric Dram Cell For High-Density NVRAM's, IEEE Electron Device Letters, vol. 11, No. 10, 1990, pp. 454-456.
Arnett, Ferroelectric FET Device, IBM Technical Disclosure Bulletin, vol. 15, No. 9, Feb. 1973, p. 2,825.
W. I. Kinney, W. Shepherd, W. Miller, J. Evans, and R. Womack, "A Non-Volatile Memory Cell Based on Ferroelectric Storage Capacitors," pp. 850-851, IEDM 87, Dec. 1987.

Primary Examiner—Eugene R. LaRoche
Assistant Examiner—Son Dinh
Attorney, Agent, or Firm—Finnegan, Henderson, Farabow, Garrett & Dunner

[57] ABSTRACT

An insulating layer is formed on a transistor having a source region/drain region and a gate electrode. Contact holes are formed in this insulating layer in association with the source region/drain region and the gate electrode. A memory element having a ferroelectric substance layer is provided in that contact hole which is associated with the source region/drain region. This memory element comprises a first electrode provided on the source region/drain region, a ferroelectric substance layer provided on the first electrode, and a second electrode provided on the ferroelectric substance layer. Providing this memory element in the contact hole which is associated with the source region/drain region can make cells flatter and permit metal wires to be surely formed in the contact holes.

18 Claims, 5 Drawing Sheets

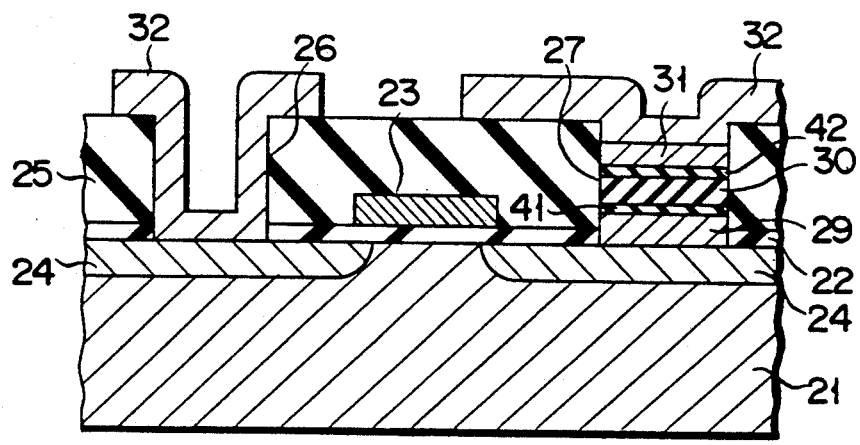
F I G. 3

SEMICONDUCTOR MEMORY DEVICE HAVING A FERROELECTRIC SUBSTANCE AS A MEMORY ELEMENT

BACKGROUND OF THE INVENTION

1. Field of the Invention

The present invention relates to a semiconductor integrated circuit with high integration. More particularly, this invention pertains to an EEPROM (Electrically Erasable Programmable Read Only Memory) using a ferroelectric substance as a memory element.

2. Description of the Related Art

It is known that EEPROMs have been developed which accumulate potentials by the hysteresis of a ferroelectric substance.

FIG. 4 illustrates a method of fabricating a conventional EEPROM of this type. As shown in FIG. 4A, after a device isolation area (not shown) is formed on the surface of a P type silicon substrate by an LOCOS (Local Oxidation) method, the resultant structure is oxidized using oxygen diluted by hydrochloric acid (HCl) or argon (Ar), thereby forming a silicon oxide film which will serve as a gate insulating film 2.

Then, a polycrystalline silicon film is deposited on the gate insulating film 2 using an LPCVD (Low-Pressure Chemical Vapor Deposition) method, and patterned, forming a gate electrode 3 as a word line. With the polycrystalline silicon film constituting this gate electrode 3 used as a mask, phosphorus (P) or arsenic (As) is ion-implanted in the P type silicon substrate 1, then thermally diffused, thus forming a source or drain region 4.

After a silicon oxide film serving as a interlayer insulating film 5 is deposited using a CVD (Chemical Vapor Deposition) method, the tungsten (W) is vapor-deposited on the silicon oxide film and patterned to be a first electrode 9 as shown in FIG. 4B. Then, a ferroelectric substance layer 6 is formed on the first electrode 9 through magnetron sputtering using a PZT-based ceramic target. PbSr{(YNb)TiZr}O$_3$+Sb$_2$O$_3$ which has a titanate and a zirconate as main substances is used as the PZT-based ceramic, and with the substrate heated to 300° C., the ferroelectric substance layer 6 is formed 4500 Å thick at a speed of 600 Å/hr.

Thereafter, tungsten (W) is vapor-deposited as a second electrode 10 of the ferroelectric substance layer 6, and this layer 6 and the electrodes 9 and 10 are patterned, followed by deposition of an interlayer insulating film 7 by the CVD method, as shown in FIG. 4C. Then, as shown in FIG. 4D, multiple contact holes 11 are formed in the interlayer insulating film 7, etc., and aluminum (Al) is deposited on the resultant structure by a sputtering method, and patterned, followed by formation of metal wires 8, which are connected to the source or drain region 4, the gate electrode 3, and the first and second electrodes 9 and 10 both connected to the ferroelectric substance layer 6. These metal wires 8 which are connected to the gate electrode 3 and the first electrode 9 are not illustrated.

In an EEPROM cell having the aforementioned ferroelectric substance, after the formation of the second electrode 10, this electrode 10 is coupled to the source or drain region 4 of a transistor using the metal wire 8. Because of the connection of the second electrode 10 to the source or drain region 4 within a single cell, the layout of the metal wires 8 becomes complicated, and the cell size will be restricted by the width of the metal wires 8 and the space between the wires 8.

Because the ferroelectric substance layer 6 is formed above the gate electrode 3, the cell becomes thicker and the metal wires 8 have large stepped portions, which may cause processing-oriented defects of the metal wires 8, such as the wires being open-circuited or short-circuited somewhere.

SUMMARY OF THE INVENTION

It is therefore an object of the present invention to provide a semiconductor memory device which can permit the memory cells to be designed thinner and flatter, and can prevent metal wires from being open-circuited or short-circuited.

To achieve this object, the semiconductor memory device according to the present invention comprises:

a transistor having a diffusion layer as a source region/drain region and a gate electrode;

an insulating layer provided on the transistor;

a plurality of contact holes formed in the insulating layer in association with the diffusion layer and the gate electrode;

a memory element provided in one of the contact holes provided in association with the diffusion layer, the memory element adjoining to the diffusion layer; and metal wires formed in the contact holes.

With the above structure, as a memory element is provided in that contact hole which is associated with the source or drain region of the transistor, the memory element can be connected to the source or drain region without using any metal wire. This can simplify the layout of the metal wires and make the cells thinner and flatter, thus preventing the metal wires from being open-circuited or short-circuited.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a cross-sectional view of the second embodiment of the present invention;

DETAILED DESCRIPTION OF THE PREFERRED EMBODIMENTS

A preferred embodiment of the present invention will now be described referring to the accompanying drawings.

FIG. 1 depicts an EEPROM according to this embodiment.

Figure 1A:
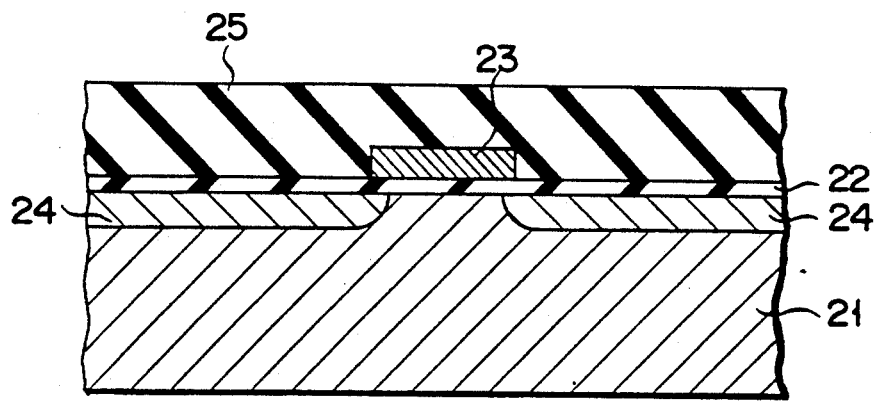
FIGS. 1A to 1D are cross-sectional views illustrating the steps of fabricating a semiconductor memory device according to one embodiment of the present invention.

As shown in FIG. 1A, after a device isolation area (not shown) is formed on the surface of a P type silicon substrate 21 by an LOCOS method, the resultant structure is oxidized using oxygen diluted by hydrochloric acid (HCl) or argon (Ar), thereby forming a silicon oxide film 150 Å thick which will serve as a gate insulating film 22.

Then, a polycrystalline silicon film is deposited, for example, 4000 Å thick on the gate insulating film 22 using an LPCVD method, and patterned, forming a gate electrode 23 which will serve as a word line. With the polycrystalline silicon film as the gate electrode 23 used as a mask, phosphorus (P) or arsenic (As) is ion-implanted in the P type silicon substrate 21 then thermally diffused, thus forming a source or drain region 24. Further, a silicon oxide film as an interlayer insulating film 25 is deposited, for example, 5000 Å thick by a CVD method.

Figure 1B:
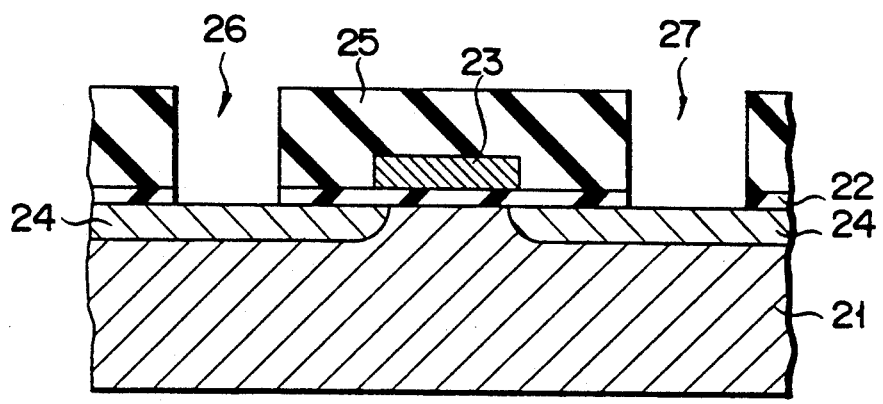
Figure 2:
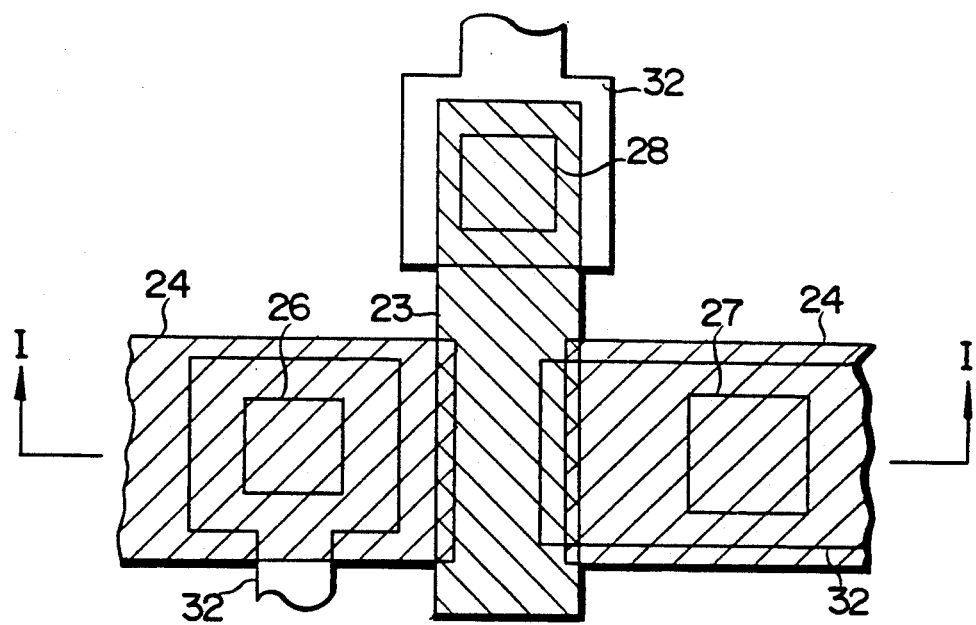
FIG. 2 is a plan view showing the essential portions of the semiconductor memory device in FIG. 1.
Figure 4A:
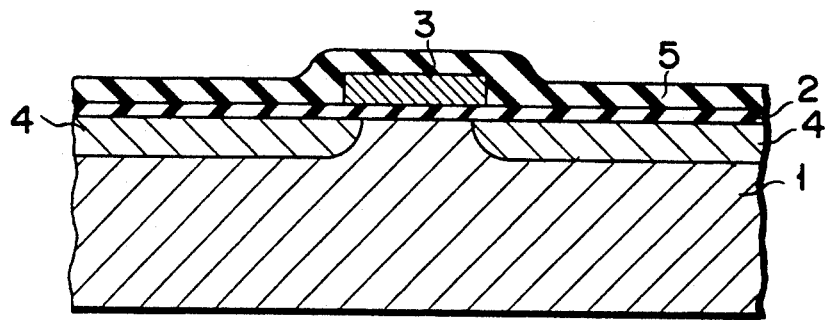
FIGS. 4A to 4D are cross-sectional views illustrating the steps of fabricating a conventional semiconductor memory device.
Figure 4B:
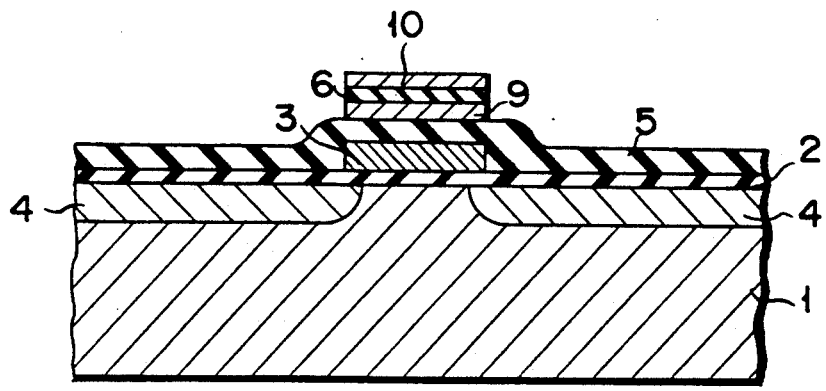
Figure 4C:
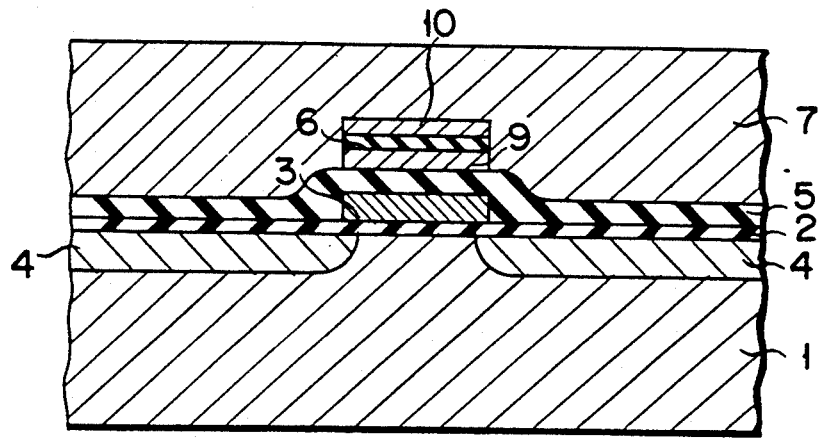
Figure 4D:
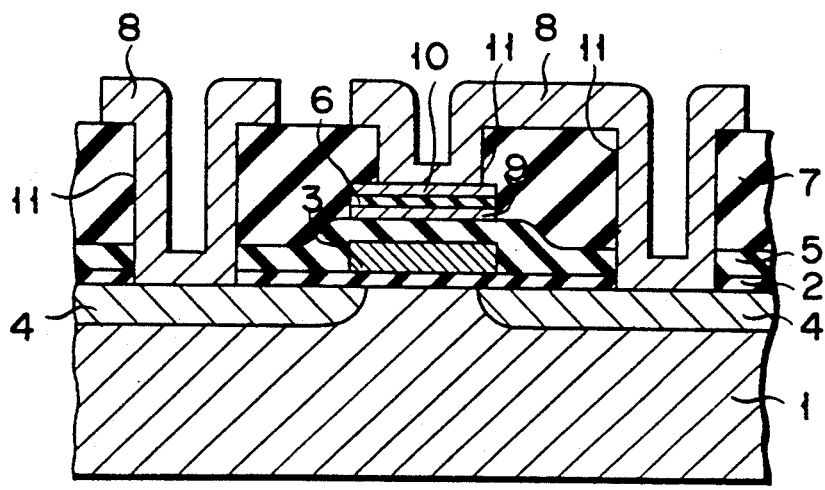

Then, as shown in FIG. 1B and FIG. 2, contact holes 26, 27 and 28 are formed in the silicon oxide film 25 and the gate insulating film 22 corresponding to the source or drain region 24, and the silicon oxide film 25 corresponding to the gate electrode 23 by an RIE (Reactive Ion Etching) method.

Figure 1C:
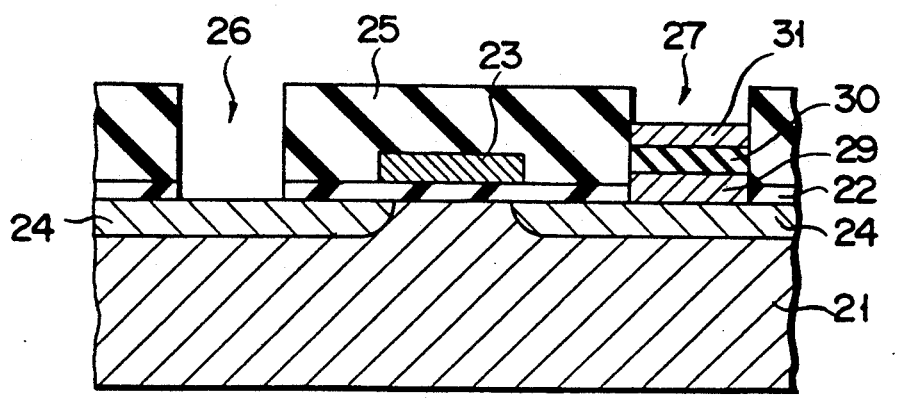

Then, as shown in FIG. 1C, tungsten is selectively vapor-deposited approximately 500 Å thick only on the source or drain region 24 in the contact hole 27 using a mask (not shown), and is patterned to be a first electrode 29. Then, a ferroelectric substance layer 30 is formed on the first electrode 29 through magnetron sputtering using a PZT-based ceramic target. $PbSr\{(YNb)TiZr\}O_3 + Sb_2O_3$ which has a titanate and a zirconate as main substances is used as the PZT-based ceramic, and with the substrate heated to 300° C., the ferroelectric substance layer 30 is formed 4500 Å thick at a speed of 600 Å/hr.

Figure 1D:
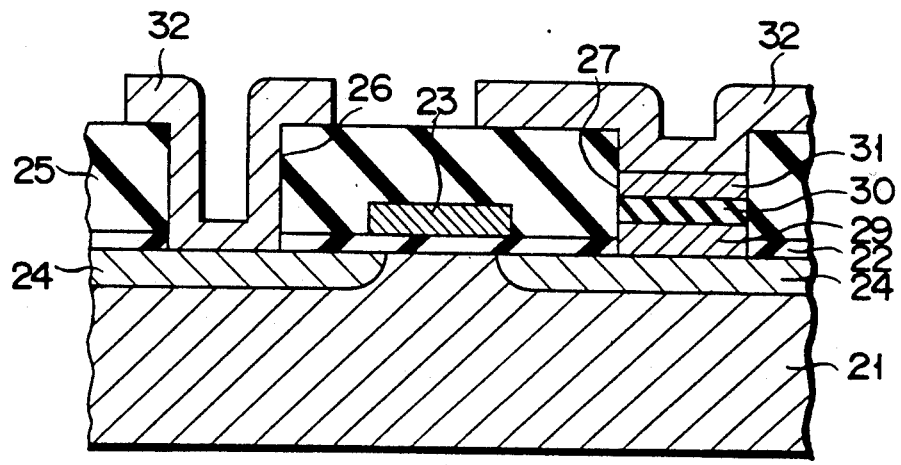

Thereafter, tungsten is vapor-deposited as a second electrode 31 on the ferroelectric substance layer 30, and this layer 30 and the first and second electrodes 29 and 31 are patterned. Then, as shown in FIG. 1D and FIG. 2, aluminum (Al) is deposited in the contact holes 26, 27 and 28 by the sputtering method, and is patterned to thereby form metal wires 32. Through the above fabrication processes, an EEPROM having the ferroelectric substance layer 30 as a memory element can be fabricated.

This EEPROM is designed such that the ferroelectric substance layer 30 and the gate electrode 23 are formed side by side, and the first electrode 29 underlying the ferroelectric substance layer 30 is coupled to directly to the source or drain region 24 of the transistor.

According to the above embodiment, as the first electrode 29 connected to the ferroelectric substance layer 30 is formed on the source or drain region 24 of the transistor for direct connection thereto, the number of required contact holes can be reduced compared with the prior art, thus simplifying the layout of the metal wires.

In addition, since the ferroelectric substance layer 30 serving as a memory element is provided at substantially the same level as the gate electrode 23 not above the gate electrode 23, the cells can be made thinner. This can permit the contact holes 26, 27 and 28 to be formed shallower, so that when aluminum is vapor-deposited as metal wires in these holes, the metal wires will be prevented from being open-circuited or short-circuited.

The second embodiment of the present invention will be depicted below referring to FIG. 3, in which like reference numerals are given to the portions identical or corresponding to those shown in FIG. 1.

Referring to FIG. 3, polysilicon oxide films 41 and 42, for example, are respectively provided between the ferroelectric substance layer 30 and the first electrode 29, and between the ferroelectric substance layer 30 and the second electrode 31. The provision of the polysilicon oxide films 41 and 42 can enhance the breakdown voltage between the first electrode 29 and the second electrode 31 even when the ferroelectric substance layer 30 is thin.

Figure 5:
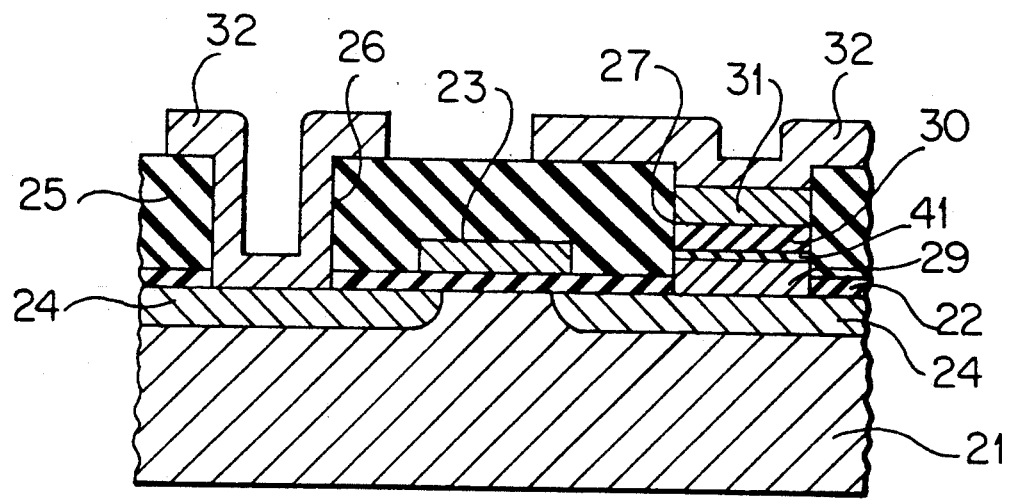
FIG. 5 is a cross-sectional view of an alternative embodiment of the present invention.
Figure 6:
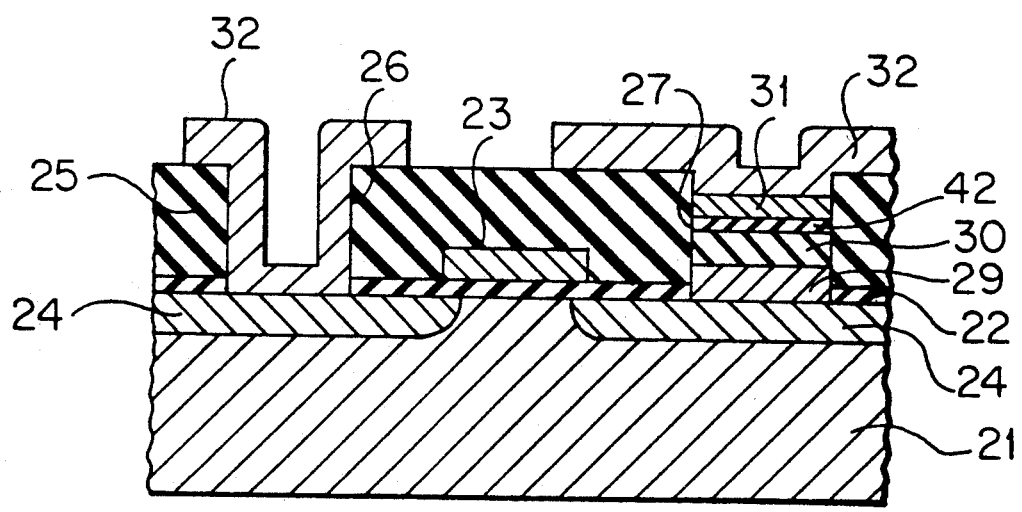
FIG. 6 is a cross-sectional view of another alternative embodiment of the present invention.

The polysilicon oxide film should not necessarily be provided on either surface of the ferroelectric substance layer 30, but it is sufficient to provide this film on at least one of the surfaces of the layer 30 to improve the breakdown voltage between the first electrode 29 and the second electrode 31. In other words, the memory element may include a first electrode on the diffusion layer, a silicon oxide film on the first electrode, a ferroelectric substance layer on the silicon oxide film, a second electrode on the ferroelectric substance layer, and metal wires connected to the second electrode, as shown in FIG. 5. Alternatively, the memory element may include a first electrode on the diffusion layer, a ferroelectric substance layer on the first electrode, a silicon oxide film on the ferroelectric substance layer, a second electrode on the silicon oxide film, and metal wires connected to the second electrode, as shown in FIG. 6.

The present invention is not limited to the above-described embodiments, but may be modified in various manners without departing from the scope and spirit of the invention.

What is claimed is:

1. A semiconductor memory device comprising:
   a transistor having a gate electrode and a diffusion layer defining a source region and a drain region;
   an insulating layer on said transistor, said insulating layer defining a plurality of contact holes corresponding to said diffusion layer and to said gate electrode;
   a memory element in one of said contact holes corresponding to said diffusion layer, said memory element including
      a first electrode on said diffusion layer, the first electrode having a first major surface,
      a ferroelectric substance layer having a second major surface and a third major surface, the first and second major surfaces defining an interface that is parallel to the diffusion layer,
      a second electrode, the second electrode having a fourth major surface, the third and fourth major surfaces defining an interface that is parallel to the diffusion layer,
      a metal wire on the second electrode,
   wherein the gate electrode is located at a first level relative to the diffusion layer and the ferroelectric substance layer is located at a level substantially the same as the first level.

2. A device according to claim 1, wherein said memory element further comprises:
   a first silicon oxide film between said first electrode and said ferroelectric substance layer; and
   a second silicon oxide film between said ferroelectric substance layer
   and said second electrode.

3. An EEPROM comprising:
a transistor having a gate electrode and a diffusion layer defining a source region and a drain region;
an insulating layer on said transistor, said insulating layer defining a plurality of contact holes corresponding to said diffusion layer and said gate electrode;
a memory element in one of said contact holes corresponding to said diffusion layer, said memory element including
a first electrode on said diffusion layer, the first electrode having a first major surface,
a ferroelectric substance layer having a second major surface and a third major surface, the first and second major surfaces defining an interface that is parallel to the diffusion layer,
a second electrode, the second electrode having a fourth major surface, the third and fourth major surfaces defining an interface that is parallel to the diffusion layer
a metal wire on the second electrode,
wherein the gate electrode is located at a first level relative to the diffusion layer and the ferroelectric substance layer is located at a level substantially the same as the first level.

4. A device according to claim 3, wherein said memory element comprises:
a first electrode on said diffusion layer;
a first silicon oxide film on said first electrode;
a ferroelectric substance layer on said first silicon oxide film;
a second silicon oxide film on said ferroelectric substance layer; and
a second electrode on said silicon oxide film, connected to said metal wires.

5. An EEPROM using a memory element having a ferroelectric substance layer, comprising:
a transistor having a gate electrode and a diffusion layer defining a source region and a drain region;
an insulating layer on said transistor, said insulating layer defining a plurality of contact holes corresponding to said diffusion layer and to said gate electrode;
a first electrode in a one of said contact holes corresponding to said diffusion layer, and adjoining to said diffusion layer, said first electrode having a first major surface;
a ferroelectric substance layer in the one of the contact holes, the ferroelectric substance layer having a second major surface and a third major surface, the first and second major surfaces defining an interface that is parallel to the diffusion layer;
a second electrode having a fourth major surface, the third and fourth major surfaces defining an interface that is parallel to the diffusion layer; and
metal wires on said in said contact holes and on said insulating layer in said contact holes, wherein the gate electrode is located at a first level relative to the diffusion layer and the ferroelectric substance layer is located at a level substantially the same as the first level.

6. An EEPROM using a memory element having a ferroelectric substance layer, comprising:
a transistor having a diffusion layer as a source region/drain region and a gate electrode;
an insulating layer on said transistor, said insulating layer defining a plurality of contact holes corresponding to said diffusion layer and to said gate electrode;
a first electrode in one of said contact holes corresponding to said diffusion layer, said adjoining to said diffusion layer;
a ferroelectric substance layer on said first electrode;
a first silicon film on said first electrode;
a ferroelectric substance layer on said first silicon film;
a second silicon film on said ferroelectric substance layer; and
a second electrode on said silicon film; and
metal wires on said in said contact holes and on said insulating layer in said contact holes.

7. A semiconductor memory device comprising:
a transistor having a gate electrode and a diffusion layer defining a source region and a drain region;
an insulating layer on the transistor, the insulating layer defining a plurality of contact holes corresponding to the diffusion layer and to the gate electrode;
a memory element in one of the contact holes corresponding to the diffusion layer, the memory element including:
a first electrode on the diffusion layer;
a ferroelectric element having a ferroelectric substance layer and a silicon oxide film on the ferroelectric substance layer;
a second electrode on the ferroelectric element, and
a metal wire on the second electrode.

8. A semiconductor memory device comprising:
a transistor having a gate electrode and a diffusion layer defining a source region and a drain region;
an insulating layer on the transistor, the insulating layer defining a plurality of contact holes corresponding to the diffusion layer and to the gate electrode;
a memory element in one of the contact holes corresponding to the diffusion layer, the memory element including
a first electrode on the diffusion layer,
a silicon oxide film on the first electrode,
a ferroelectric substance layer on the silicon oxide film,
a second electrode on the ferroelectric substance layer, and
a metal wire on the second electrode.

9. A semiconductor memory device comprising:
a transistor having a gate electrode and a diffusion layer defining a source region and a drain region;
an insulating layer on the transistor, the insulating layer defining a plurality of contact holes corresponding to the diffusion layer and to the gate electrode;
a memory element in one of the contact holes corresponding to the diffusion layer, the memory element including
a first electrode on the diffusion layer
a ferroelectric substance layer on the first electrode,
a silicon oxide film on the ferroelectric substance layer,
a second electrode on the silicon oxide film, and
a metal wire on the second electrode.

10. A device according to claim 9, wherein the gate electrode is at a first level relative to the diffusion layer and the ferroelectric substance layer is at a level substantially the same as the first level.

11. A device according to claim 10, wherein the gate electrode is at a first level relative to the diffusion layer and the ferroelectric substance layer is at a level substantially the same as the first level.

12. A device according to claim 9, wherein the gate electrode is at a first level relative to the diffusion layer and the ferroelectric substance layer is at a level substantially the same as the first level.

13. A device according to claim 7, wherein the ferroelectric substance layer has a major surface that is parallel to the diffusion layer.

14. A device according to claim 8, wherein the ferroelectric substance layer has a major surface that is parallel to the diffusion layer.

15. A device according to claim 9, wherein the ferroelectric substance layer has a major surface that is parallel to the diffusion layer.

16. A device according to claim 10, wherein the ferroelectric substance layer has a major surface that is parallel to the diffusion layer.

17. A device according to claim 11, wherein the ferroelectric substance layer has a major surface that is parallel to the diffusion layer.

18. A device according to claim 12, wherein the ferroelectric substance layer has a major surface that is parallel to the diffusion layer.

* * * * *